(12) United States Patent
Higuchi et al.

(10) Patent No.: US 7,830,215 B2
(45) Date of Patent: *Nov. 9, 2010

(54) PIEZOELECTRIC OSCILLATOR AND METHOD FOR MANUFACTURING THE SAME

(75) Inventors: Takamitsu Higuchi, Matsumoto (JP); Juri Kato, Chino (JP); Yasuhiro Ono, Suwa (JP)

(73) Assignee: Seiko Epson Corporation (JP)

( * ) Notice: Subject to any disclaimer, the term of this patent is extended or adjusted under 35 U.S.C. 154(b) by 29 days.

This patent is subject to a terminal disclaimer.

(21) Appl. No.: 12/019,244

(22) Filed: Jan. 24, 2008

(65) Prior Publication Data

US 2008/0180186 A1  Jul. 31, 2008

(30) Foreign Application Priority Data

Jan. 25, 2007  (JP) ............................. 2007-014836

(51) Int. Cl.
H03B 5/32 (2006.01)
(52) U.S. Cl. .............. 331/158; 331/116 R; 331/116 M; 331/154; 333/187; 333/195; 333/227; 310/322; 257/E21.461
(58) Field of Classification Search .................. 331/158, 331/116 R, 116 FE, 116 M, 154; 333/187, 333/189, 192, 195, 227; 310/322; 438/478, 438/52; 257/E21.461
See application file for complete search history.

(56) References Cited

U.S. PATENT DOCUMENTS

| 4,672,849 A | * | 6/1987 | Hoshino | ...................... 73/579 |
| 5,023,503 A | | 6/1991 | Legge et al. | |
| 5,589,084 A | * | 12/1996 | Ji et al. | ........................ 216/24 |
| 5,796,000 A | | 8/1998 | Fujiu et al. | |
| 5,802,684 A | | 9/1998 | Fujiu et al. | |
| 5,877,889 A | * | 3/1999 | Um et al. | ..................... 359/295 |
| 5,914,507 A | * | 6/1999 | Polla et al. | ................... 257/254 |
| 6,842,088 B2 | * | 1/2005 | Yamada et al. | ............... 333/187 |

(Continued)

FOREIGN PATENT DOCUMENTS

JP  05-037287  2/1993

(Continued)

Primary Examiner—Arnold Kinkead
Assistant Examiner—Richard Tan
(74) Attorney, Agent, or Firm—Harness, Dickey & Pierce, P.L.C.

(57) ABSTRACT

A method for manufacturing a piezoelectric oscillator includes the steps of: forming a first semiconductor layer above a substrate; forming a second semiconductor layer above the first semiconductor layer; forming a first opening section that exposes the substrate by removing the second semiconductor layer and the first semiconductor layer in an area for forming a support section; forming the support section in the first opening section; forming a driving section that generates flexing vibration in an oscillation section above the second semiconductor layer; patterning the second semiconductor layer to form the oscillation section having the supporting section as a base end and another end provided so as not to contact the supporting section, and a second opening section that exposes the first semiconductor layer; and removing the first semiconductor layer through a portion exposed at the second opening section by an etching method, thereby forming a cavity section at least below the oscillation section, wherein the step of forming the driving section includes the steps of forming a first electrode, forming a piezoelectric layer above the first electrode, and forming a second electrode above the piezoelectric layer.

6 Claims, 8 Drawing Sheets

U.S. PATENT DOCUMENTS

| | | | |
|---|---|---|---|
| 7,002,437 B2* | 2/2006 | Takeuchi et al. | 333/187 |
| 7,420,320 B2* | 9/2008 | Sano et al. | 310/363 |
| 7,427,797 B2* | 9/2008 | Ohguro et al. | 257/415 |
| 2003/0119220 A1* | 6/2003 | Mlcak et al. | 438/52 |
| 2004/0147132 A1* | 7/2004 | Nam et al. | 438/720 |
| 2005/0051515 A1* | 3/2005 | Nam | 216/27 |
| 2005/0099236 A1* | 5/2005 | Kawakubo et al. | 331/107 A |
| 2005/0210988 A1* | 9/2005 | Amano et al. | 73/704 |
| 2006/0186762 A1* | 8/2006 | Sugiura et al. | 310/328 |
| 2007/0158552 A1* | 7/2007 | Kim et al. | 250/306 |
| 2008/0143450 A1* | 6/2008 | Matsumoto et al. | 331/116 R |

FOREIGN PATENT DOCUMENTS

| | | |
|---|---|---|
| JP | 07-113643 | 5/1995 |
| JP | 7-298394 | * 11/1995 |
| JP | 2003-258589 | * 9/2003 |
| JP | 2005-249395 | 9/2005 |
| JP | 2005-291858 | 10/2005 |

* cited by examiner

PIEZOELECTRIC OSCILLATOR AND METHOD FOR MANUFACTURING THE SAME

The entire disclosure of Japanese Patent Application No. 2007-014836, filed Jan. 25, 2007 is expressly incorporated by reference herein.

BACKGROUND

1. Technical Field

The present invention relates to piezoelectric oscillators and methods for manufacturing the same.

2. Related Art

Tuning fork type 32 kHz quartz oscillators are used in oscillator sections of clock modules in clocks and information devices such as microcomputers in order to take advantage of the traditional design assets and their power saving property. However, the arm length of the tuning fork arm in the case of a tuning fork type 32 kHz quartz oscillator is several mm, and therefore the overall length including its package may amount to about 10 mm.

In recent years, instead of quart, piezoelectric oscillators having a driving section formed from a piezoelectric thin film sandwiched between upper and lower electrodes formed on a silicon substrate have been developed. As the structure of such piezoelectric oscillators, a beam type structure (see FIG. 1 of Japanese Laid-open patent application JP-A-2005-291858) and a tuning fork type structure equipped with two beams (see FIG. 1 of Japanese Laid-open patent application JP-A-2005-249395) are known. Even with such piezoelectric oscillators, the silicon substrate can only be made at most to a thickness of about 100 µm. Therefore, in order to obtain a resonance frequency in a several tens kHz band, the arm length of the beam needs to be several mm or greater, which may lead to a problem in that miniaturization of the clock module is difficult.

SUMMARY

In accordance with an advantage of some aspects of the invention, it is possible to provide a piezoelectric oscillator that is very small in size, and is capable of providing, for example, a resonance frequency in a several tens kHz band, and a method for manufacturing the same.

A method for manufacturing a piezoelectric oscillator in accordance with an embodiment of the invention includes the steps of: forming a first semiconductor layer above a substrate; forming a second semiconductor layer above the first semiconductor layer; forming a first opening section that exposes the substrate by removing the second semiconductor layer and the first semiconductor layer in an area for forming a support section; forming the support section in the first opening section; forming a driving section that generates flexing vibration in an oscillation section above the second semiconductor layer; patterning the second semiconductor layer to form the oscillation section having the supporting section as a base end and another end provided so as not to contact the supporting section, and a second opening section that exposes the first semiconductor layer; and removing the first semiconductor layer through a portion exposed at the second opening section by an etching method, thereby forming a cavity section at least below the oscillation section, wherein the step of forming the driving section includes the steps of forming a first electrode, forming a piezoelectric layer above the first electrode, and forming a second electrode above the piezoelectric layer.

According to the method for manufacturing a piezoelectric oscillator in accordance with the present embodiment, the oscillation section can be obtained by patterning the second semiconductor layer. The second semiconductor layer can be formed very thin above the first semiconductor layer. Therefore, according to the method for manufacturing a piezoelectric oscillator, the oscillation section can be formed very thin. Accordingly, in a piezoelectric oscillator that may generate a resonance frequency of an oscillator that is used for a clock module, the oscillation section can be made shorter in length. In other words, the piezoelectric oscillator can be made smaller in size, compared to a piezoelectric oscillator that uses quartz.

It is noted that, in the descriptions concerning the invention, the term "above" may be used, for example, in a manner as "a specific element (hereafter referred to as "A") is formed 'above' another specific element (hereafter referred to as "B")." In the descriptions concerning the invention, in the case of such an example, the term "above" is used, while assuming that it include a case in which A is formed directly on B, and a case in which A is formed above B through another element.

In the method for manufacturing a piezoelectric oscillator in accordance with an aspect of the embodiment of the invention, in the step of removing the first semiconductor layer, the etching rate of the first semiconductor layer may be greater than the etching rate of any of the substrate, the oscillation section and the supporting section.

In the method for manufacturing a piezoelectric oscillator in accordance with an aspect of the embodiment of the invention, the first semiconductor layer may be formed from silicon germanium, and the substrate, the oscillation section and the supporting section may be formed from silicon.

In the method for manufacturing a piezoelectric oscillator in accordance with an aspect of the embodiment of the invention, the oscillation section may be formed to have a thickness of 100 nm or less.

In the method for manufacturing a piezoelectric oscillator in accordance with an aspect of the embodiment of the invention, the oscillation section may be formed to have a length of 100 µm or less.

It is noted that, in the present embodiment, the length of the oscillation section is a distance between the affixed end of the oscillation section and its free end in a plan view. Also, a distance between two ends of the oscillation section in a direction perpendicular to the lengthwise direction of the oscillation section is called a width of the oscillation section. Furthermore, for example, the length of the piezoelectric layer is a length of the piezoelectric layer in the lengthwise direction of the oscillation section, and the width of the piezoelectric layer is a width of the piezoelectric layer in the widthwise direction of the oscillation section.

In the method for manufacturing a piezoelectric oscillator in accordance with an aspect of the embodiment of the invention, the piezoelectric oscillator may be formed to have a resonance frequency at $2^{13}$ Hz (8.192 kHz) or higher, and $2^{15}$ Hz (32.768 kHz) or lower.

A piezoelectric oscillator in accordance with an embodiment of the invention includes: a substrate; a supporting section formed above the substrate; an oscillation section having one end affixed to the supporting section and another free end; and a driving section that is formed above the oscillation section and generates flexing vibration in the oscillation section, wherein the driving section includes a first electrode, a piezoelectric layer formed above the first electrode, and a second electrode formed above the piezoelectric layer, and the oscillation section is composed of a material different from a material of the supporting section.

It is noted that, in the present invention, materials having different states, such as, for example, single crystal silicon, polycrystal silicon and amorphous silicon, are treated as different materials.

In the piezoelectric oscillator in accordance with an aspect of the embodiment of the invention, the oscillation section may be composed of semiconductor, and the supporting section may be composed of dielectric.

In the piezoelectric oscillator in accordance with an aspect of the embodiment of the invention, the oscillation section may be composed of single crystal silicon, and the supporting section may be composed of polycrystal silicon or amorphous silicon.

DESCRIPTION OF EXEMPLARY EMBODIMENTS

Preferred embodiments of the invention are described below with reference to the accompanying drawings.

Figure 1:
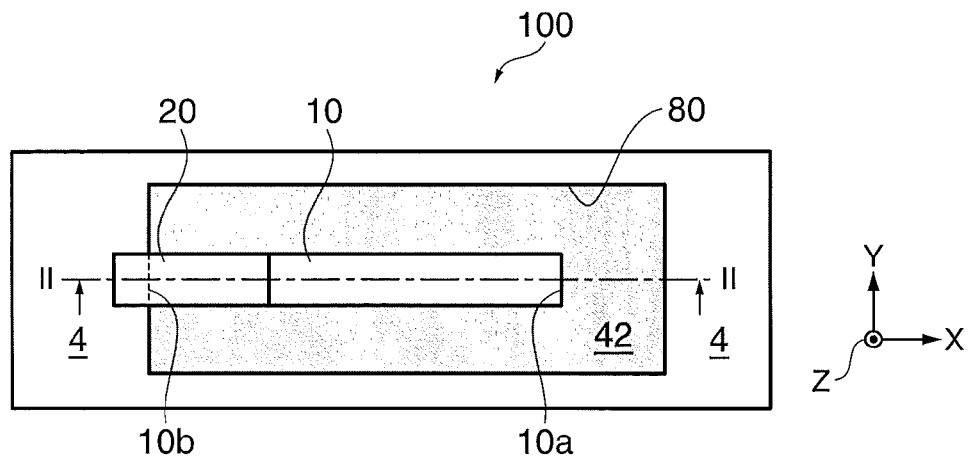
FIG. 1 is a schematic plan view of a piezoelectric oscillator in accordance with an embodiment of the invention.
Figure 2:
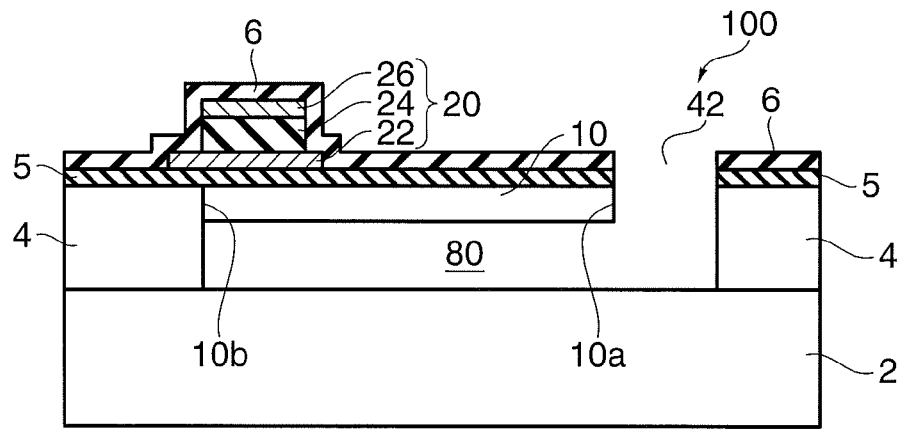
FIG. 2 is a schematic cross-sectional view of the piezoelectric oscillator in accordance with the embodiment of the invention.

1. First, a piezoelectric oscillator 100 in accordance with an embodiment of the invention is described. FIG. 1 is a plan view schematically showing the piezoelectric oscillator 100 in accordance with the present embodiment, and FIG. 2 is a cross-sectional view schematically showing the piezoelectric oscillator100. It is noted that FIG. 2 is a cross-sectional view taken along a line II-II in FIG. 1. Also, in FIG. 1, illustration of a base layer 5 and a protection layer 6 to be described below is omitted for the sake of convenience.

The piezoelectric oscillator 100 includes a substrate 2, a supporting section 4, an oscillation section 10 and a driving section 20, as shown in FIG. 1 and FIG. 2.

As the substrate 2, for example, a semiconductor substrate may be used. As the semiconductor substrate, for example, a single crystal silicon substrate may be enumerated. For example, various kinds of semiconductor circuits (not shown) may be formed in the substrate 2. The use of a silicon substrate as the semiconductor substrate 2 may be advantageous because an ordinary semiconductor manufacturing technology can be used.

The supporting section 4 can supports the oscillation section 10. The supporting section 4 may be formed, for example, in a rectangular frame shape, as shown in the figure.

One end of the oscillation section 10 is affixed to an inner side of the supporting section 4, and the other end is a free end. The oscillation section 10 may be formed from, for example, a single beam, and the piezoelectric oscillator 100 may be in a unimorph type. The oscillation section 10 may have a plane configuration that is, for example, rectangular (oblong or square), and is in an oblong shape in the illustrated example. The oscillation section 10 is, for example, 10 nm or more but 100 nm less in thickness. The thickness of the oscillation section 10 is desirably 100 nm or less for miniaturization of the piezoelectric oscillator 100. The length of the oscillation section 10 is, for example, 10 µm or more but 100 µm or less.

The oscillation section 10 may be composed of, for example, the same material as that of the supporting section 4. The oscillation section 10 and the supporting section 4 may be composed of, for example, semiconductor. As the semiconductor, for example, single crystal silicon may be enumerated.

Figure 3:
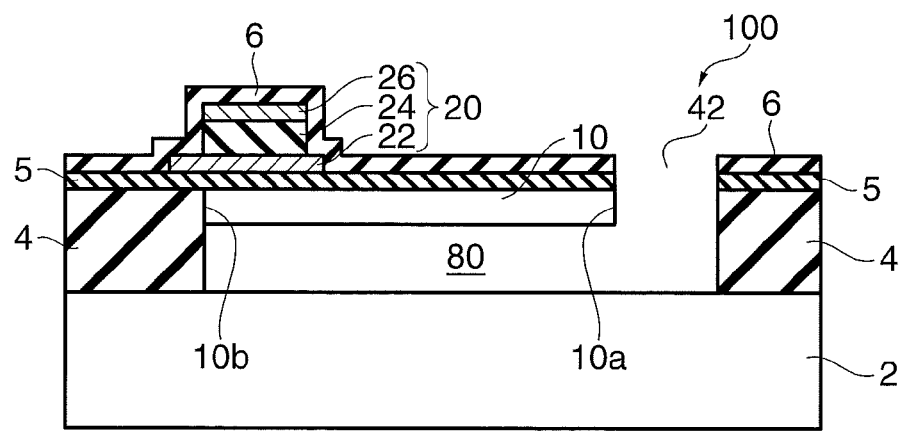
FIG. 3 is a schematic cross-sectional view of the piezoelectric oscillator in accordance with the embodiment of the invention.

Also, the oscillation section 10 may be composed of, for example, a material different from that of the supporting section 4. For example, as shown in FIG. 3, the oscillation section 10 may be composed of semiconductor, and the supporting section 4 may be composed of dielectric. FIG. 3 is a schematic cross-sectional view of the piezoelectric oscillator 100 in this case. As the semiconductor, for example, single crystal silicon may be enumerated. As the dielectric, for example, silicon oxide ($SiO_2$) may be enumerated. Also, for example, the oscillation section 10 may be composed of single crystal silicon, and the supporting section 4 may be composed of polycrystal silicon or amorphous silicon.

The oscillation section 10 is formed over a cavity section 80 that is formed by removing a portion of a first semiconductor layer 60 to be described below, as shown in FIG. 2. The cavity section 80 is formed on the substrate 2. The cavity section 80 is surrounded by the supporting section 4. The cavity section 80 has a plane configuration that is, for example, rectangular, and in the illustrated example is in an oblong shape, and its longer-side direction is in the same direction as the lengthwise direction (X direction) of the oscillation section 10.

An opening section 42 that allows vibration of the oscillation section 10 is formed around the oscillation section 10. The opening section 42 is provided between the oscillation section 10 and the supporting section 4. The opening section 42 and the oscillation section 10, when viewed as one body in a plan view (FIG. 1), coincide with, for example, the cavity section 80.

The driving section 20 is formed on the oscillation section 10. The driving section 20 generates flexing vibration of the oscillation section 10. For example, as shown in FIG. 1, a single driving section 20 may be provided on a single beam section. The driving section 20 has a plane configuration that is, for example, rectangular, and in the illustrated example is in an oblong shape, and its longer-side direction is in the same direction as the lengthwise direction (X direction) of the oscillation section 10. The driving section 20 has, as shown in FIG. 2, a first electrode 22 formed above the oscillation section 10, a piezoelectric layer 24 formed on the first electrode 22, and a second electrode 26 formed on the piezoelectric layer 24. The driving section 20 may further have a base layer 5 formed between the oscillation section 10 and the first electrode 22. The major portion of the driving section 20 is formed on the oscillation section 10 on the affixed end side thereof, for example, as shown in FIG. 1 and FIG. 2. A portion of the driving section 20 (more specifically, the base layer 5 and the first electrode 22) is also formed, for example, on the supporting section 4. The base layer 5 may cover, for example, the top surface of the oscillation section 10 and the top surface of the supporting section 4.

The base layer 5 is a dielectric layer, such as, a silicon oxide ($SiO_2$) layer, a silicon nitride ($Si_3N_4$) layer or the like. The base layer 5 may be formed from a compound layer of, for example, 2 or more layers.

As the first electrode 22, for example, a platinum (Pt) layer may be used. The first electrode 22 may have any thickness as long as it provides a sufficiently low electrical resistance value, and may be, for example, 10 nm or more but 100 nm or less.

The piezoelectric layer 24 may be formed from piezoelectric material, such as, for example, lead zirconate titanate (Pb (Zr, Ti) $O_3$:PZT), lead zirconate titanate solid solution or the like. As the lead zirconate titanate solid solution, for example, lead zirconate titanate niobate (Pb (Zr, Ti, Nb) $O_3$:PZTN) and the like are enumerated. The thickness of the piezoelectric layer 24 may preferably be about the same as the thickness of the oscillation section 10. When the thickness is in such a range, a driving force that can sufficiently vibrate the beam can be secured. For example, when the thickness of the oscillation section 10 is 10 nm or greater but 100 nm or less, the thickness of the piezoelectric layer 24 can be 10 nm or greater but 100 nm or less.

As the second electrode 26, for example, a platinum (Pt) layer may be used. The second electrode 26 may have any thickness as long as it provides a sufficiently low electrical resistance value, and may be, for example, 10 nm or greater but 100 nm or less.

It is noted that, in the illustrated example, the driving section 20 has only the piezoelectric layer 24 provided between the first electrode 22 and the second electrode 26, but may have other layers in addition to the piezoelectric layer 24 between the electrodes 22 and 26. The film thickness of the piezoelectric layer 24 can be appropriately changed according to resonance conditions.

In the piezoelectric oscillator 100 in accordance with the present embodiment, electric fields in alternately opposing directions are applied to the driving section 20, thereby causing flexing vibration in the oscillation section 10 in up and down directions (Z direction).

The resonance frequency of the piezoelectric oscillator 100 in accordance with the present embodiment may be at $2^{13}$ Hz (8.192 kHz) or higher, and $2^{15}$ Hz (32.768 kHz) or lower. For example, the resonance frequency at 32.768 kHz (also simply referred to as "32 kHz") is suitable for clock modules. When the resonance frequency is $2^{15}$ Hz=32.768 kHz, it can be divided by a 15-stage flip-flop circuit whereby a signal with 1 Hz can be generated. Also, by setting the resonance frequency in a range between $2^{13}$ Hz=8.192 kHz and $2^{15}$ Hz=32.768 kHz, the flip-flop circuit can be formed not only from 15 stages, but also 14 stages or 13 stages, which can reduce the power consumption. Also, in view of power consumption, the flip-flop circuit may possibly be formed from 16 stages, and therefore the resonance frequency of the piezoelectric oscillator 100 in accordance with the present embodiment can be $2^{16}$ Hz (65.536 kHz) or lower.

Figure 9:
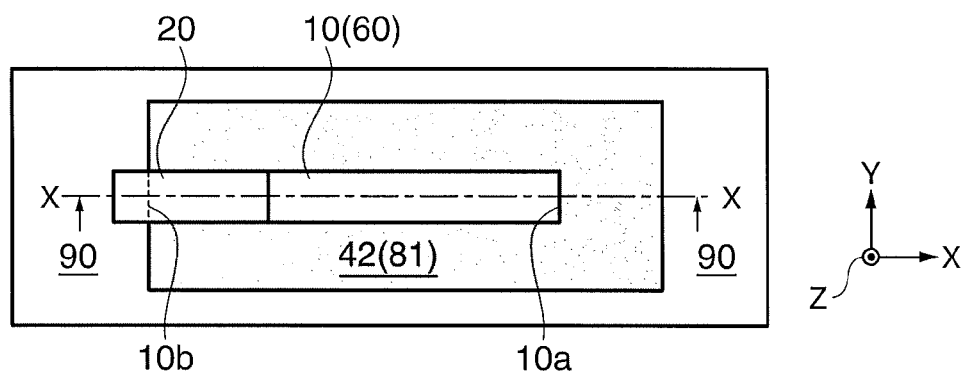
FIG. 9 is a plan view schematically showing a step of manufacturing the piezoelectric oscillator in accordance with the present embodiment.
Figure 10:
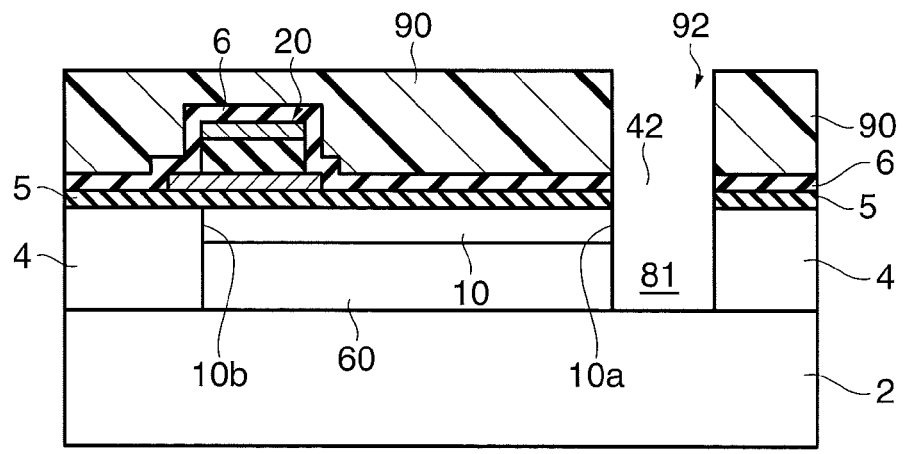
FIG. 10 is a cross-sectional view schematically showing a step of manufacturing the piezoelectric oscillator in accordance with the present embodiment.

2. Next, an example of a method for manufacturing the piezoelectric oscillator 100 in accordance with an embodiment of the invention is described with reference to the accompanying drawings. FIGS. 4-8 are cross-sectional views schematically showing a process for manufacturing the piezoelectric oscillator 100 in accordance with the present embodiment, each of which corresponds to the cross-sectional view shown in FIG. 2. Also, FIG. 9 is a plan view schematically showing a step of manufacturing the piezoelectric oscillator 100 in accordance with the present embodiment, and FIG. 10 is a cross-sectional view schematically showing a step of manufacturing the piezoelectric oscillator 100 in accordance with the present embodiment. It is noted that FIG. 10 is a cross-sectional view taken along a line X-X of FIG. 9.

Figure 4:
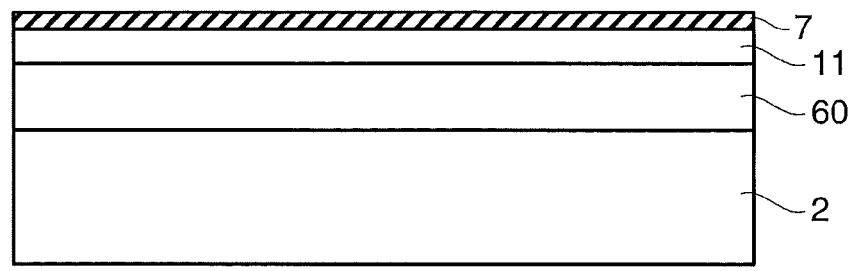
FIG. 4 is a cross-sectional view schematically showing a step of manufacturing a piezoelectric oscillator in accordance with an embodiment of the invention.

(1) First, as shown in FIG. 4, a first semiconductor layer 60 is formed on a substrate 2. The first semiconductor layer 60 is formed from, for example, silicon germanium (SiGe). For example, by using SiGe as the first semiconductor layer 60, and Si as the substrate 2, lattice matching between the semiconductor layer 60 and the substrate 2 can be obtained, and the first semiconductor layer 60 can be formed with good crystallinity. The first semiconductor layer 60 may be formed by, for example, a CVD (Chemical Vapor Deposition) method.

(2) Next, as shown in FIG. 4, a second semiconductor layer 11 is formed on the first semiconductor layer 60. The second semiconductor layer 11 is formed from, for example, silicon (Si). For example, by using Si as the second semiconductor layer 11, and SiGe as the first semiconductor layer 60, lattice matching between the second semiconductor layer 11 and the first semiconductor layer 60 can be obtained, and the second semiconductor layer 11 can be formed with good crystallinity. Also, various kinds of semiconductor circuits (not shown) can be formed in the second semiconductor layer 11, like the substrate 2. The use of silicon as the second semiconductor layer 11 may be advantageous because an ordinary semiconductor manufacturing technology can be used. The second semiconductor layer 11 may be formed by, for example, a CVD method.

(3) Next, as shown in FIG. 4, an oxide layer 7 may be formed on the second semiconductor layer 11. The oxide layer may be formed from, for example, silicon oxide (SiO$_2$). The oxide layer 7 may be formed by, for example, a thermal oxidation method.

Figure 5:
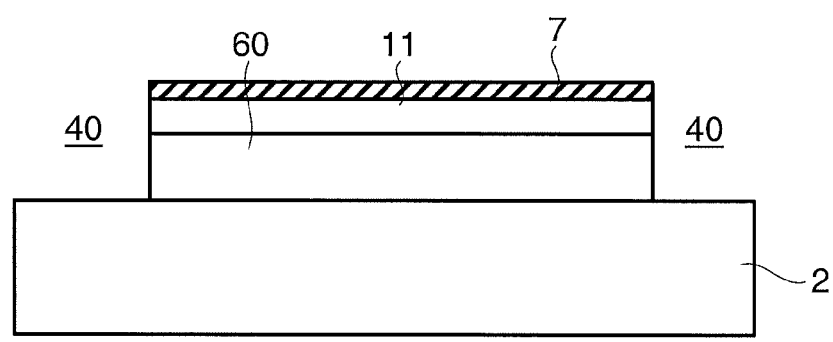
FIG. 5 is a cross-sectional view schematically showing a step of manufacturing the piezoelectric oscillator in accordance with the present embodiment.
Figure 6:
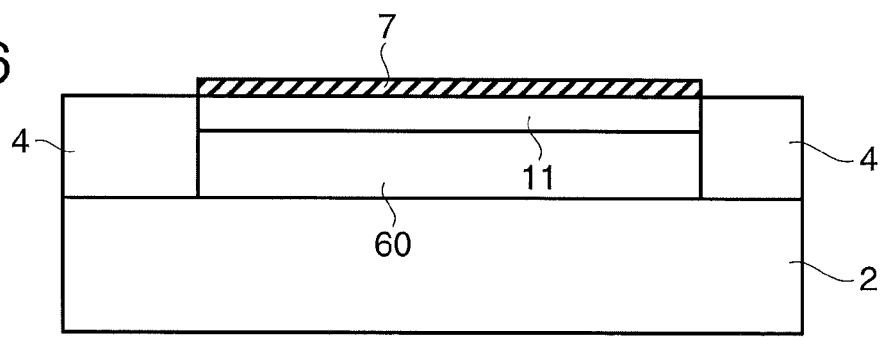
FIG. 6 is a cross-sectional view schematically showing a step of manufacturing the piezoelectric oscillator in accordance with the present embodiment.

(4) Next, as shown in FIG. 5, the oxide layer 7, the second semiconductor layer 11 and the first semiconductor layer 60 are patterned, whereby a first opening section 40 that exposes the substrate 2 is formed. By this step, the second semiconductor layer 11 and the first semiconductor layer 60 in a forming region to form a supporting section 4 (see FIG. 1 and FIG. 2) are removed. The oxide layer 7, the second semiconductor layer 11 and the first semiconductor layer 60 may be patterned by, for example, photolithography technique and etching technique.

(5) Next, the supporting section 4, that covers the exposed top surface of the substrate 2, the exposed side surface of the first semiconductor layer 60 and the exposed side surface of the second semiconductor layer 11, is formed inside the first opening section 40. For example, the supporting section 4 can be formed in a manner that the first opening section 40 is embedded entirely up to the position of the top surface of the second semiconductor layer 11. Further, although not shown, for example, the supporting section 4 may be thinly formed, and the supporting section 4 may be formed in a manner that the position of a portion of the top surface of the supporting section 4 is lower than the position of the top surface of the second semiconductor layer 11. The supporting section 4 may be formed by, for example, a CVD method.

The supporting section 4 may be formed from, for example, silicon (Si). For example, by using Si for both of the supporting section 4 and the substrate 2, the supporting section 4 can be epitaxially grown on the substrate 2, and the supporting section 4 can be formed with good crystallinity. Further, for example, by using Si as the supporting section 4, SiGe as the first semiconductor layer 60, and Si as the second semiconductor layer 11, the supporting section 4 can be epitaxially grown from the side surface of the first semiconductor layer 60 and the side surface of the second semiconductor layer 11. By this, the supporting section 4 can be formed with good crystallinity.

Also, for example, after forming the supporting section 4, a covering layer (not shown) may be further formed on the supporting section 4. The covering layer and the supporting section 4 may be formed together in a single step. The covering layer can be formed in a manner to cover the oxide layer 7. In this case, after forming the covering layer, the covering layer may be polished by, for example, a chemical mechanical polishing (CMP) method, until the oxide layer 7 is exposed. The oxide layer 7 can be used as a stopper layer in the CMP method.

Next, the oxide layer 7 may be removed by, for example, a wet etching method.

Figure 7:
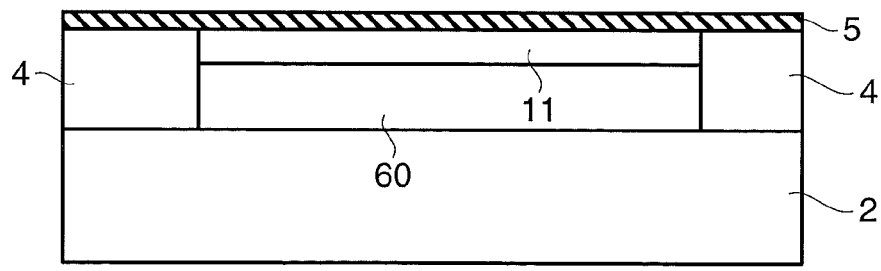
FIG. 7 is a cross-sectional view schematically showing a step of manufacturing the piezoelectric oscillator in accordance with the present embodiment.

(6) Then, as shown in FIG. 7, a base layer 5 may be formed over the entire surface of the second semiconductor layer 11 and the supporting section 4. The base layer 5 may be formed by a thermal oxidation method, a CVD method, a sputter method or the like.

Figure 8:
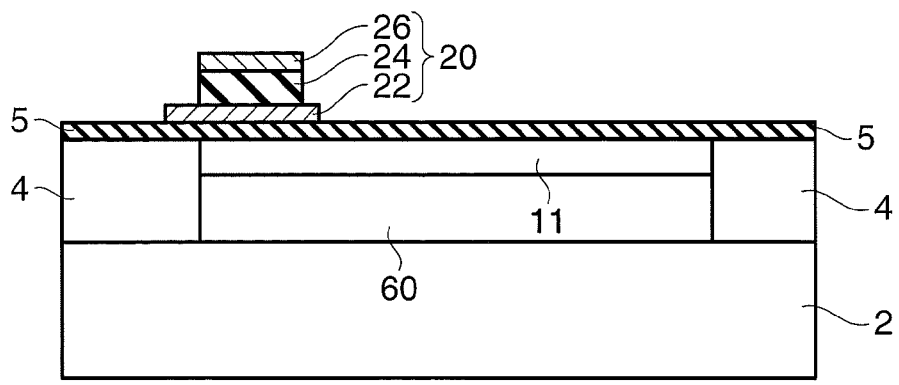
FIG. 8 is a cross-sectional view schematically showing a step of manufacturing the piezoelectric oscillator in accordance with the present embodiment.

(7) Next, as shown in FIG. 8, a driving section 20 is formed above the second semiconductor layer 11. More specifically, on the base layer 5 is formed a first electrode 22, a piezoelectric layer 24 and a second electrode 26 composing the driving section 20.

First, on the entire top surface of the base layer 5, layers for the first electrode 22, the piezoelectric layer 24 and the second electrode 26 are formed in this order. The first electrode 22 may be formed by a vapor deposition method, a sputter method or the like. The piezoelectric layer 24 may be formed by a solution method (sol-gel method), a laser ablation method, a vapor deposition method, a sputter method, a CVD method, or the like. The second electrode 26 may be formed by a vapor deposition method, a sputter method, a CVD method or the like.

Next, the second electrode 26 and the piezoelectric layer 24 may be patterned into a desired configuration. The patterning may be conducted by, for example, photolithography technique and etching technique.

Then, for example, the first electrode 22 is patterned into a desired configuration. The patterning may be conducted by, for example, photolithography technique and etching technique.

(8) Next, a protection layer 6 (see FIG. 10) that covers the surface of the driving section 20 and the base layer 5 may be formed. The protection layer 6 may be formed by a CVD method or the like.

Then, the second semiconductor layer 11 is patterned into a desired configuration, whereby an oscillation section 10 and a second opening section 42 are formed. The oscillation section 10 may be obtained by forming the second opening section 42 that cuts through the second semiconductor layer 11 and exposes the upper surface of the first semiconductor layer 60. The oscillation section 10 is provided with the inner side of the supporting section 4 as its base end, and in a manner that the other end of the oscillation section 10 would not contact the supporting section 4.

More specifically, first, resist is coated on the entire surface over the substrate 2, and then the resist is patterned by a photolithography method, whereby a resist layer 90 that covers the surface area other than the second opening section 42 is formed, as shown in FIG. 9 and FIG. 10. Next, with the resist layer 90 being used as a mask, a portion of the protection layer 6, a portion of the base layer 5 and a portion of the second semiconductor layer 11 are removed by a dry etching method. In this etching step, the first semiconductor layer 60 can be used as an etching stopper layer. In other words, when etching the second semiconductor layer 11, the etching rate of the first semiconductor layer 60 is lower than the, etching rate of the second semiconductor layer 11.

In a manner described above, the oscillation section 10 and the second opening section 42 are formed.

Next, for example, the first semiconductor layer 60 is patterned in a desired shape, whereby a third opening section 81 can be formed. More specifically, for example, with the resist layer 90 being used as a mask, a portion of the first semiconductor layer 60 is removed by a dry etching method or the like, whereby the third opening section 81 that cuts through the first semiconductor layer 60 and exposes the substrate 2 is formed. In this etching step, the substrate 2 can be used as an etching stopper layer. In other words, when etching the first semiconductor layer 60, the etching rate of the substrate 2 is lower than the etching rate of the first semiconductor layer 60. It is noted that the third opening section 81 and the second opening section 42 described above can be formed altogether in a single process.

(9) Next, the first semiconductor layer 60 is removed through the portion exposed by the second opening section 42 and the third opening section 81 by an etching method, whereby a cavity section 80 is formed at least below the oscillation section 10 (see FIG. 1 and FIG. 2). The cavity section 80 is formed in a manner that the oscillation section 10 can have flexing vibration in a state where the free end 10a of the oscillation section 10 is free from mechanical force of constraint (to be described below). The cavity section 80 is formed, for example, below the oscillation section 10 and the second opening section 42.

In the step of removing the first semiconductor layer 60, the etching rate of the first semiconductor layer 60 is higher than the etching rate of any of the substrate 2, the oscillation section 10 and the supporting section 4. By this, etching of the substrate 2, the oscillation section 10 and the supporting section 4 can be suppressed, and the first semiconductor layer 60 can be selectively removed. For example, when the first semiconductor layer 60 is composed of SiGe, and the substrate 2, the oscillation section 10 and the supporting section 4 are composed of Si, the first semiconductor layer 60 may be selectively removed by a wet etching method, using, for example, a mixed solution of hydrofluoric acid and nitric acid (nitric-hydrofluoric acid). In this case, the etching selection ratio of Si with respect to SiGe can be set to about 1:100 to about 1:10000. Also, when the first semiconductor layer 60 is composed of SiGe, and the substrate 2, the oscillation section 10 and the supporting section 4 are composed of Si, the first semiconductor layer 60 may also be selectively removed by a dry etching method, using, for example, carbon tetrafluoride ($CF_4$) gas.

Then, the resist layer 90 is removed by ashing. By removing the resist layer 90, the mechanical force of constraint to the free end 10a of the oscillation section 10 is cancelled, whereby the oscillation section 10 can sufficiently vibrate.

(10) By the process described above, the piezoelectric oscillator 100 in accordance with the present embodiment is formed, as shown in FIG. 1 and FIG. 2.

3. In the method for manufacturing the piezoelectric oscillator 100 in accordance with the present embodiment, the oscillation section 10 can be obtained through patterning the second semiconductor layer 11. The second semiconductor layer 11 can be very thinly formed on the first semiconductor layer 60, such that, according to the method for manufacturing the piezoelectric oscillator 100 in accordance with the present embodiment, the thickness of the oscillation section 10 can be made very thin (for example, 100 nm or less). By this, in the piezoelectric oscillator 100 that generates a resonance frequency of a resonator that may be used in a clock module, the length of the oscillation section (beam) 10 can be made shorter. In other words, for example, compared to a piezoelectric oscillator using quartz, the piezoelectric oscillator 100 in accordance with the present embodiment can be further miniaturized. For example, when a resonance frequency at 32 kHz is used, the thickness of the oscillation section 10 can be made to 100 nm or less, the length of the oscillation section 10 can be made to 100 μm, and the package length of the piezoelectric oscillator 100 can be made to 1 mm or less.

As a concrete example of the piezoelectric oscillator 100 in accordance with the present embodiment, the thickness of the first electrode 22 is 50 nm, the thickness of the piezoelectric layer 24 is 100 nm, the thickness of the second electrode 26 is 50 nm, the thickness of the driving section 20 is 200 nm, the thickness of the oscillation section 10 is 100 nm, the beam length of the oscillation section 10 is 80 nm, and the beam width is 40 nm. A resonance frequency of flexing vibration of the piezoelectric oscillator 100 having the structure described above, in simulation through solving an equation of motion using a finite element method, is 32 kHz.

Also, according to the method for manufacturing the piezoelectric oscillator 100 in accordance with the present embodiment, the piezoelectric oscillator 100 can be fabricated by using, for example, an inexpensive Si substrate as the substrate 2. Accordingly, for example, a SOI substrate, which is expensive, does not have to be used, such that the manufacturing cost can be reduced.

Also, with the piezoelectric oscillator 100 in accordance with the present embodiment in a unimorph type, the resonance frequency is proportional to the thickness of the oscillation section 10. Accordingly, by the piezoelectric oscillator 100, the resonance frequency can be adjusted by the thickness of the oscillation section 10. For example, when the oscillation section is in a tuning fork shape, the resonance frequency is proportional to the width of the oscillation section. Accordingly, in the case of a tuning fork type piezoelectric oscillator, the width of its oscillation section may be reduced as a measure to lower its resonance frequency, but its processing technology has a limitation. In contrast, according to the piezoelectric oscillator 100 in a unimorph type in accordance with the present embodiment, the thickness of the oscillation section 10 may be made thinner as a measure to lower the resonance frequency. Accordingly, a desired resonance frequency can be obtained without any limitation to the processing technology to be applied to the oscillation section 10.

Also, in the piezoelectric oscillator 100 in a unimorph type in accordance with the present embodiment, one beam (oscillation section) 10 is provided with one driving section 20. For this reason, the piezoelectric oscillator 100 in accordance with the present embodiment is structurally advantageous in miniaturization.

It is noted that the piezoelectric oscillator 100 in accordance with the present embodiment may also be used as a trigger generator in asynchronous circuits such as circuits that do not essentially require a timing device.

Also, according to the piezoelectric oscillator 100 in accordance with the present embodiment, another cavity section similar to the cavity section 80 of the piezoelectric oscillator 100 may be formed over the substrate 2 in areas other than the area where the piezoelectric oscillator 100 is formed, and a dielectric layer may be formed in the cavity section, whereby, for example, a SOI (Silicon On Insulator) structure can be formed. For example, a semiconductor integrated circuit may be formed on the dielectric layer of the SOI structure. Therefore, according to the piezoelectric oscillator 100 in accordance with the present embodiment, the semiconductor integrated circuit using the SOI structure and the piezoelectric oscillator 100 may be mixed and mounted on a single substrate thereby forming a piezoelectric oscillator module. As a result, the module package can be made smaller.

Moreover, for example, an oscillation circuit can be formed on the dielectric layer in the SOI structure described above. Therefore, according to the piezoelectric oscillator 100 in accordance with the present embodiment, the oscillation circuit using the SOI structure and the piezoelectric oscillator 100 can be mixed and mounted on a single substrate. A device with the SOI structure can be operated with a low operation voltage. Therefore, according to the piezoelectric oscillator 100 in accordance with the present embodiment, one-chip clock modules with low power consumption can be provided.

4. Next, piezoelectric oscillators and methods for manufacturing the same in accordance with modified examples of the present embodiment are described with reference to the accompanying drawings. It is noted that features different from those of the piezoelectric oscillator 100 and its manufacturing method described above (hereafter referred to as an "example of piezoelectric oscillator 100") are described, and description of the same features is omitted.

Figure 11:
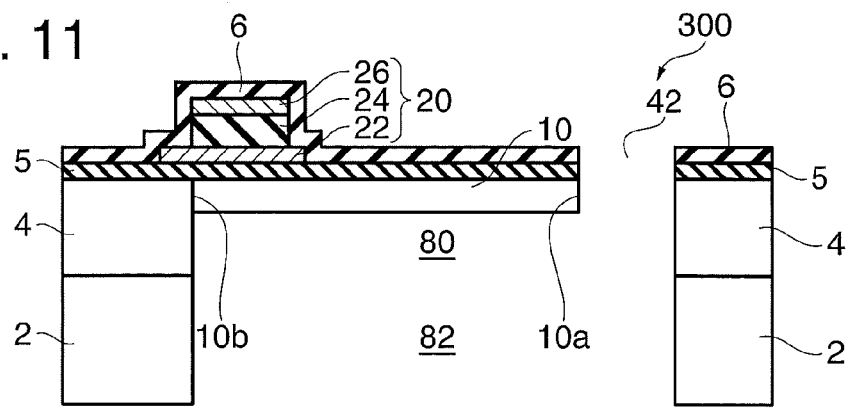
FIG. 11 is a cross-sectional view schematically showing a piezoelectric oscillator in accordance with a modified example of the present embodiment.

(1) First, a first modified example is described. FIG. 11 is a schematic cross-sectional view of the piezoelectric oscillator 300 in accordance with the modified example.

In the present modified example, a substrate opening section 82 may be provided below the cavity section 80. More specifically, the cavity section 80 may be formed above the substrate opening section 82 formed by removing a portion of the substrate 2.

To obtain the piezoelectric oscillator 300 in accordance with the present modified example, for example, first, the process up to forming an oscillation section 10 and a second opening section 42 are conducted, in a manner similar to the example of piezoelectric oscillator 100.

Then, the substrate 2 is patterned in a desired configuration, thereby forming the substrate opening section 82. The substrate opening section 82 is formed by cutting through the substrate 2 so as to expose the first semiconductor layer 60. More concretely, first, resist is coated on the entire upper and lower surfaces of the substrate 2, and then the resist coated over the lower surface of the substrate 2 is patterned by a photolithography method, whereby a second resist layer (not shown) that covers areas other than the substrate opening section 82 is formed. Next, by using the second resist layer as a mask, a portion of the substrate 2 is removed by, for example, a dry etching method. In the step of etching the substrate 2, the first semiconductor layer 60 can be used as an etching stopper layer. In other words, when etching the substrate 2, the etching rate of the first semiconductor layer 60 is lower than the etching rate of the substrate 2.

Next, the first semiconductor layer 60 is removed by, for example, a wet etching method through a portion exposed by the substrate opening section 82, whereby the cavity section 80 is formed at least below the oscillation section 10. In the etching step, the first semiconductor layer 60 can be selectively removed. Thereafter, the first resist layer 90 (see FIG. 10) and the second resist layer are removed by ashing.

By the process described above, the piezoelectric oscillator 300 in accordance with the present modified example can be formed.

Figure 12:
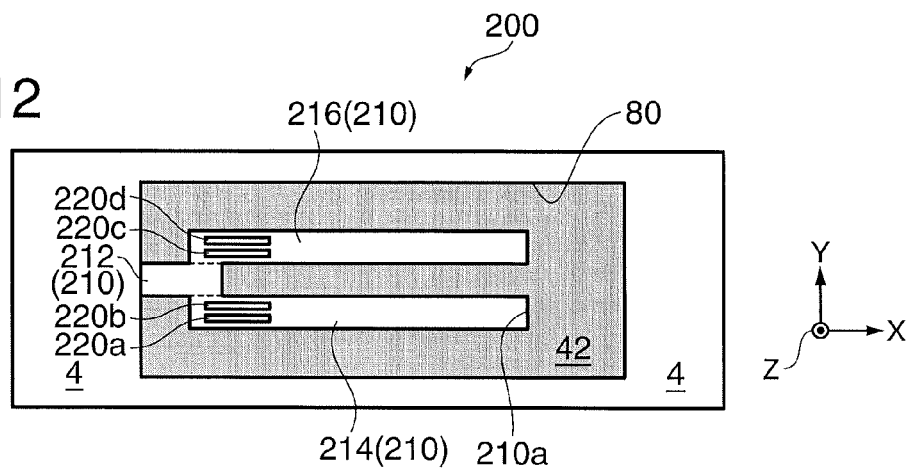
FIG. 12 is a plan view schematically showing a piezoelectric oscillator in accordance with a modified example of the present embodiment.

(2) Next, a second modified example is described. FIG. 12 is a schematic plan view of a piezoelectric oscillator 200 in accordance with the present modified example.

In the present modified example, the oscillation section 210 is formed to have a tuning fork shape composed of a base section 212 and two beam sections 214 and 216 with the base section 212 as a base end thereof. The base section 212 connects the supporting section 4 and the beam sections 214 and 216. The base section 212 has a plane configuration that is rectangular, for example, as shown in FIG. 12. The two beam sections 214 and 216 are disposed in the lengthwise direction (X direction) in parallel with each other, spaced at a predetermined gap (the width of the base section 212). The beam sections 214 and 216 each have a plane configuration that is rectangular, for example, as shown in FIG. 12.

Driving sections 220 in a pair is provided on each of the beam sections 214 and 216. On the first beam section 214 is provided a first driving section 220a and a second driving section 220b formed along the lengthwise direction of the first beam section 214 in parallel with each other. Similarly, on the second beam section 216 is provided a third driving section 220c and a fourth driving section 220d formed along the lengthwise direction of the second beam section 216 in parallel with each other. The first driving section 220a disposed on the outer side of the first beam section 214 and the fourth driving section 220d disposed on the outer side of the second beam section 216 are electrically connected together by a wiring (not shown). The second driving section 220b disposed on the inner side of the first beam section 214 and the third driving section 220c disposed on the inner side of the second beam section 216 are electrically connected together by a wiring (not shown).

(3) It is noted that the modified examples described above are only example, and the invention is not limited to these modified examples. For example, the modified examples may be appropriately combined.

5. Next, an oscillator having the piezoelectric oscillator described above is described.

Figure 13:
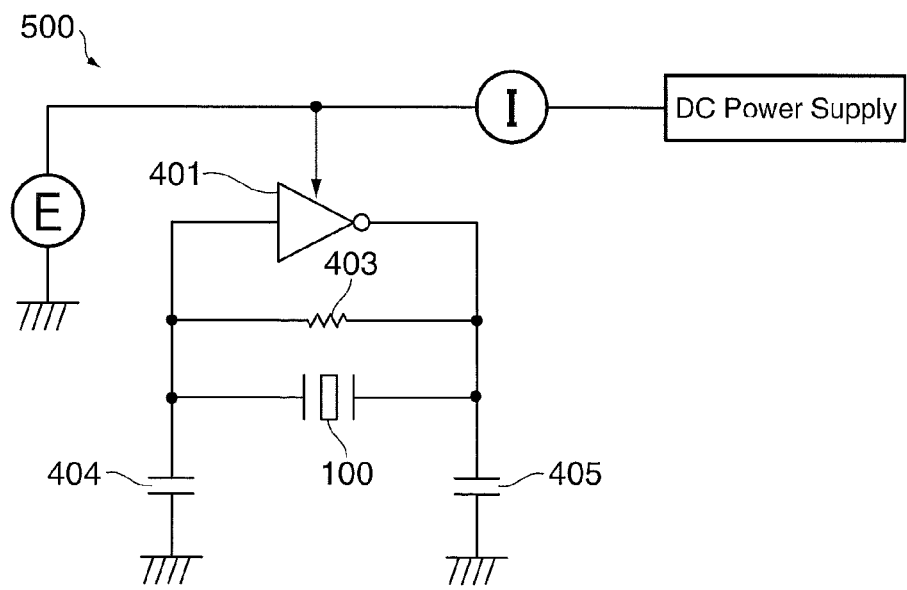
FIG. 13 is a circuit diagram of the basic structure of an oscillator in accordance with an embodiment of the invention.

FIG. 13 is a circuit diagram of a basic structure of an oscillator 500 having the piezoelectric oscillator 100 described above. The circuit (oscillation circuit) includes, for example, an amplifier 401 formed from a CMOS inverter and a feedback circuit connected between an input and an output of the amplifier 401. The feedback circuit includes a piezoelectric oscillator 100, a resistance 403 and two capacitors 404 and 405. A voltage E is applied from a DC power supply to the amplifier 401. As the power supply voltage E is increased and reaches an oscillation starting voltage, the current I rapidly increases and oscillation starts. When the power supply voltage E is further increased, the current I generally proportionally increases while maintaining the oscillation state.

Figure 14:
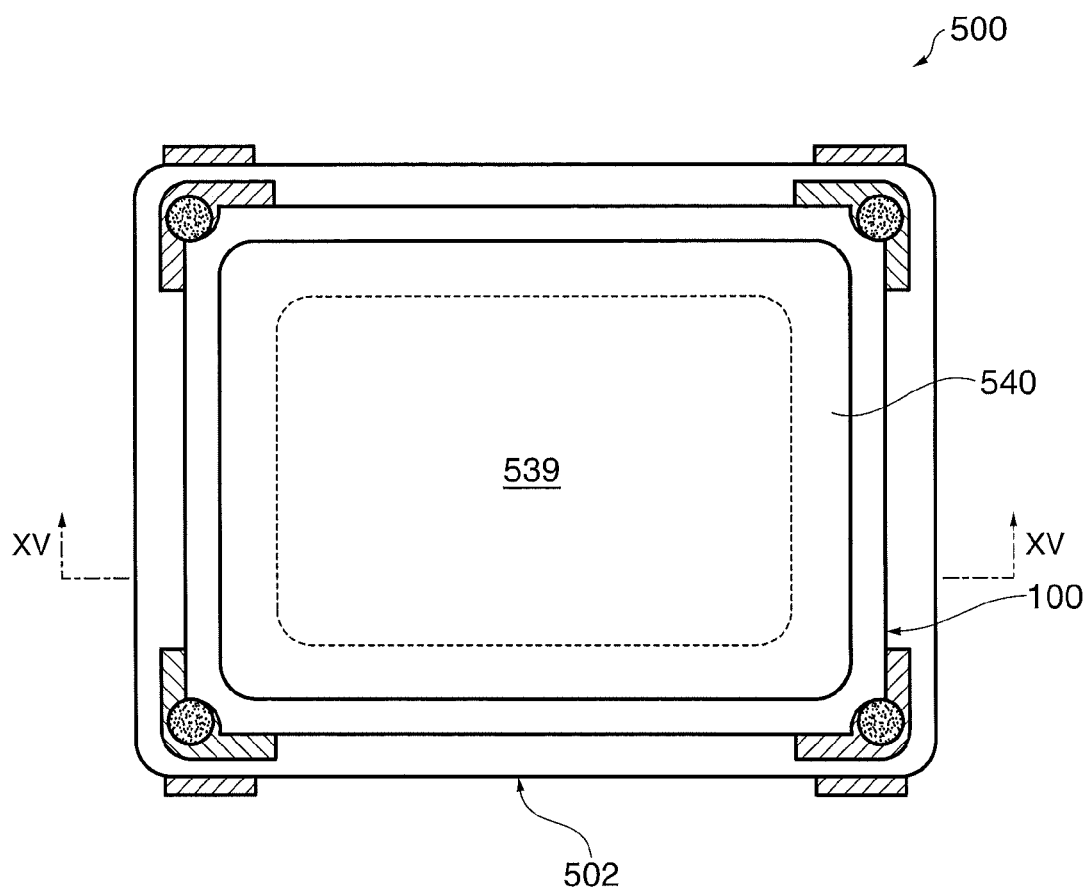
FIG. 14 is a schematic plan view of an oscillator in accordance with an embodiment of the invention.
Figure 15:
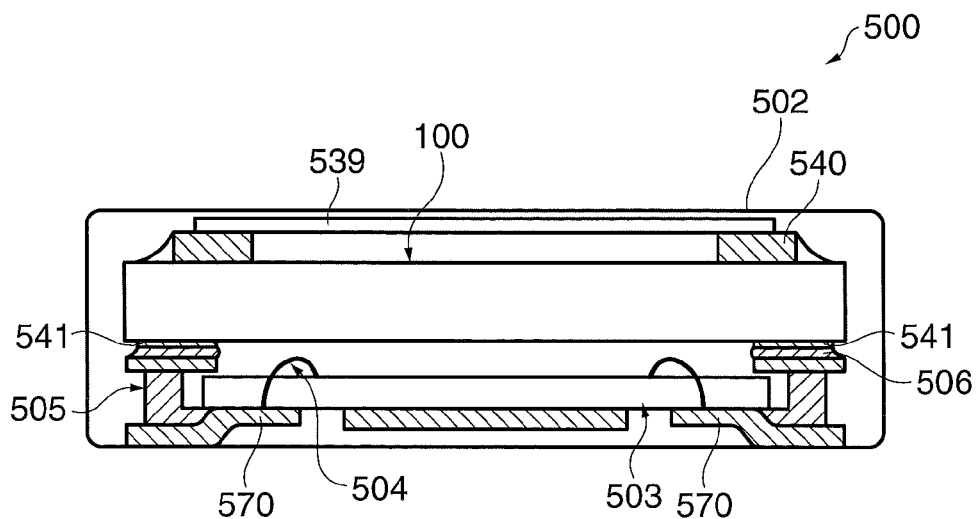
FIG. 15 is a schematic cross-sectional view of the oscillator in accordance with the embodiment of the invention.

FIG. 14 is a schematic plan view of the oscillator 500 in accordance with the present embodiment, and FIG. 15 is a schematic cross-sectional view of the oscillator 500. It is noted that FIG. 15 is a cross-sectional view taken along lines XV-XV of FIG. 14. Also, in FIG. 14 and FIG. 15, the illustration of the piezoelectric oscillator 100 is simplified for the sake of convenience.

The oscillator 500 is sealed by a sealing material 502. An IC (integrated circuit) 503 is connected to external terminals 570 by bonding wires 504 such as gold wires. The external terminals 570 are electrically connected to mounting terminals 541 through a lead frame 505 and a bonding material 506. The mounting terminals 541 are electrically connected to electrodes of the piezoelectric oscillator 100 through wirings or the like (not shown). The piezoelectric oscillator 100 is sealed by a lid member 539 and a seal member 540.

Figure 16:
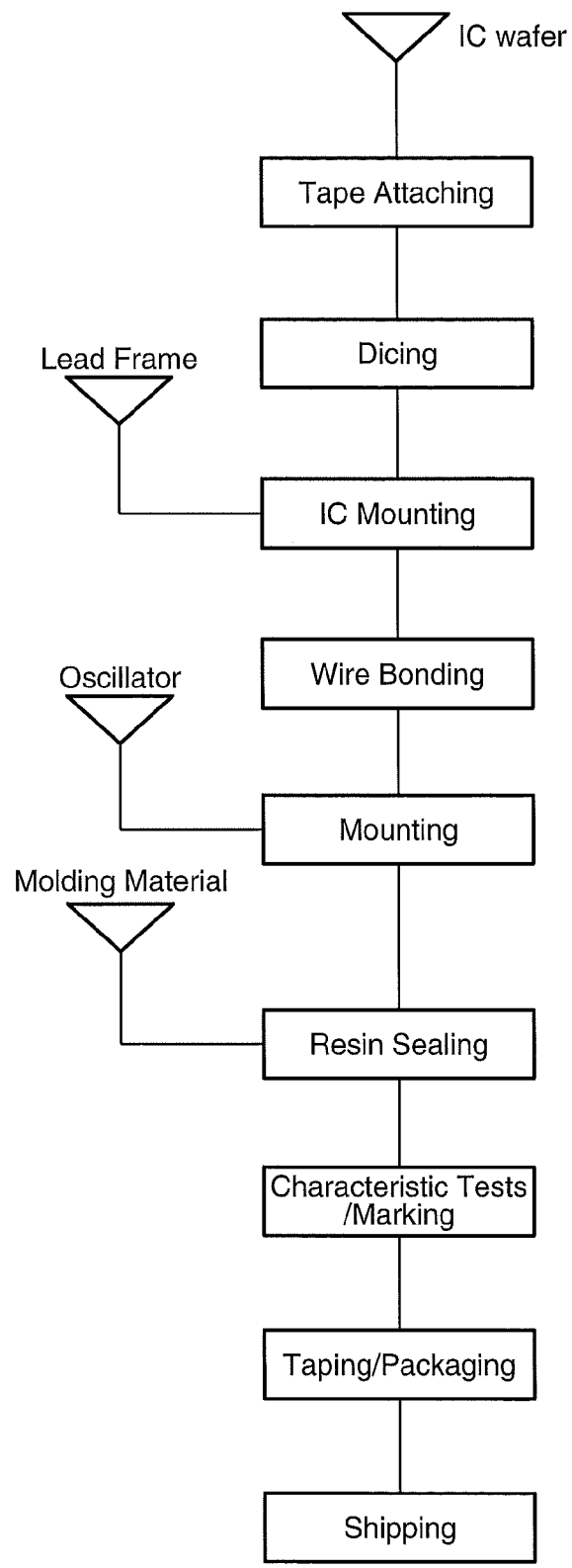
FIG. 16 is a schematic flow chart of an exemplary process of manufacturing an oscillator in accordance with an embodiment of the invention.

FIG. 16 schematically shows an example of a process for manufacturing the oscillator 500 in accordance with the present embodiment.

First, tape attaching and dicing are conducted on an IC wafer. Then, a chip with the IC 503 is mounted on the lead frame 505. Then, wire-bonding is applied to the IC 502 using the bonding wires 504.

Then, the mounting terminals 541 of the piezoelectric oscillator 100 are bonded to the lead frame 505, using the bonding material 506 such as solder, thereby mounting the piezoelectric oscillator 100. Next, the piezoelectric oscillator 100 and the IC 503 are sealed by using the sealing material (mold material) 502. Thereafter, characteristic tests, marking, taping and packing are conducted, and the product is shipped out.

Furthermore, although not illustrated, a semiconductor process may be applied to areas in the substrate 2 (see FIG. 2) and the second semiconductor layer 11 (see FIG. 4) other than the area where the piezoelectric oscillator 100 is formed, whereby an IC adjacent in the plane to the piezoelectric oscillator 100 may be formed, and thus the oscillator in accordance with the present embodiment may be formed. By this, a one-chip type oscillator can be formed, and its packaging can be omitted.

6. Next, a real-time clock having the piezoelectric oscillator described above is described.

Figure 17:
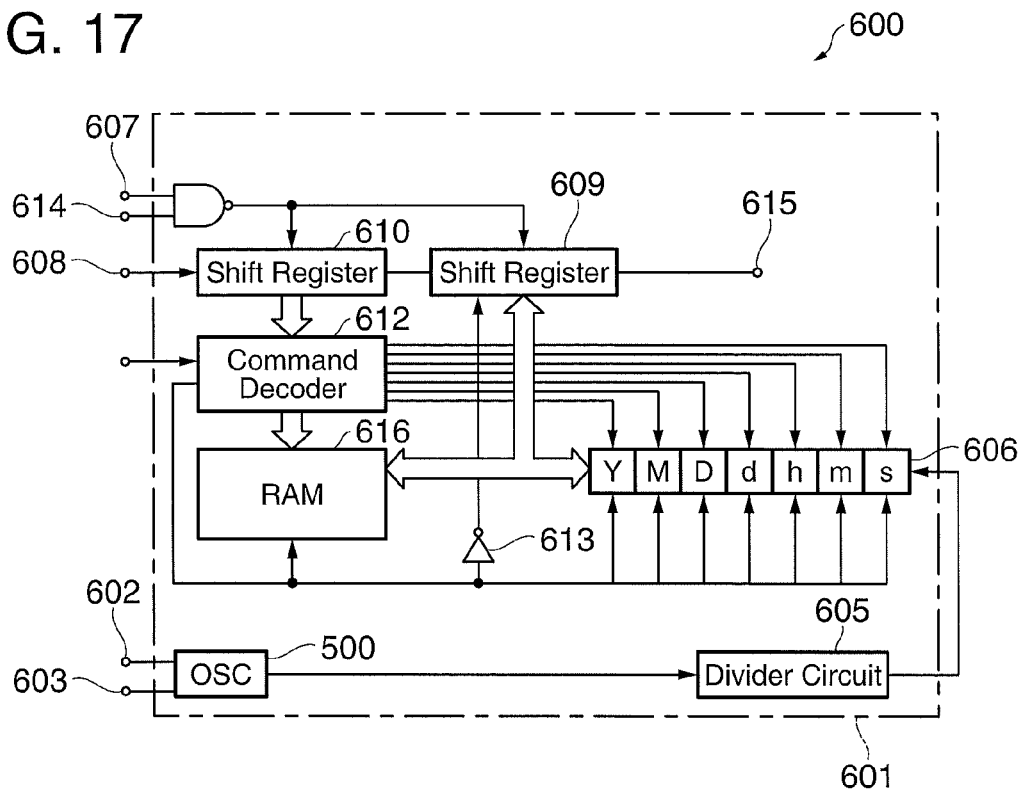
FIG. 17 is a schematic circuit block diagram of a real-time clock in accordance with an embodiment of the invention.

FIG. 17 is a circuit block diagram schematically showing a real-time clock 600 having the oscillator (OSC) 500 described above. An integrated circuit section of the real-time clock 600 is integrated in a single substrate 601, and connected to a microprocessor (not shown).

The oscillator 500 connected to timing connection terminals 602 and 603 outputs high frequency clock pulses (for example, at 32 kHz). The clock pulse is divided by a divider circuit 605, whereby timing pulses at 1 Hz are inputted in a timing counter 606. The timing counter 606 is formed from, for example, a second timing bit s, a minute timing bit m, an hour timing bit h, a day-of-week timing bit d, a day timing bit D, a month timing bit M, and a year timing bit Y. When a specified number of timing pulses is inputted in the timing counter 606, each of the timing bits is advanced.

When rewriting the timing bit of the timing counter 606, first, a selection signal is supplied from the microprocessor to an input terminal 607. Then, the microprocessor supplies to a data input terminal 608 external information composed of a data bit indicating information to be rewritten, an address bit indicating an address of the timing bit, and an operation bit indicating a write operation to be applied to the timing counter 606. As a result, the external information is stored in serially connected shift registers 609 and 610. Then, based on the operation bit and the address bit stored in the shift register 610, a command decoder 612 sends a write-enable signal to the timing counter 606, and outputs an address signal designating the timing bit. As a result, the data bit stored in the shift register 609 is written to the timing bit of the timing counter 606, whereby real-time data is rewritten.

Further, when reading out real-time data from the timing counter 606, the microprocessor sends external information having an operation bit indicating a readout operation. Then, the command decoder 612 sets the write-enable signal to the timing counter 606 to an inactive state. As a result, an inverter 613 supplies a write-enable signal in an active state to the shift register 609, whereby the shift register 609 is set to a read-enable state, and the content of the timing counter 606 is read out to the shift register 609. The real-time data read out to the shift register 609 is transferred to a data output terminal 615 in synchronism with a clock signal that is applied to the clock input terminal 614, and then sent out to, for example, a register of the microprocessor.

It is noted that data, such as, for example, calculation results may be stored in a random access memory (RAM) 616.

Figure 18:
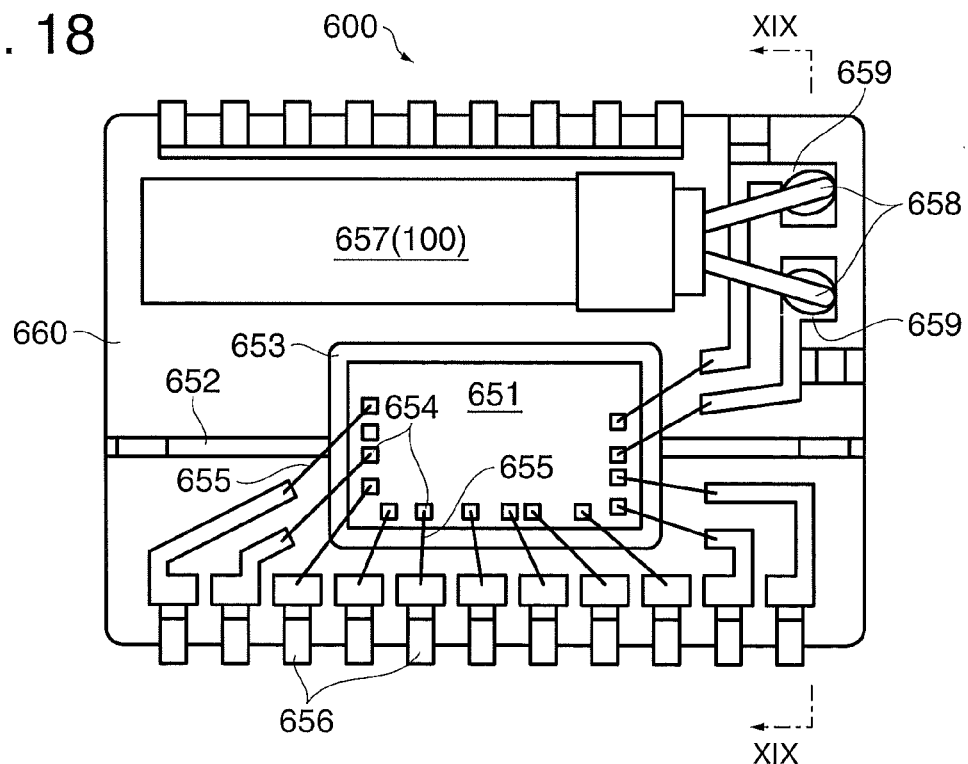
FIG. 18 is a schematic see-through plan view of a real-time clock in accordance with an embodiment of the invention.
Figure 19:
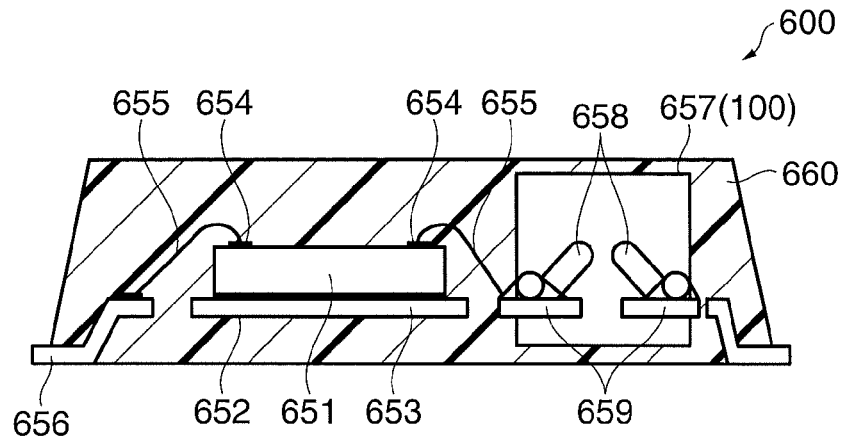
FIG. 19 is a schematic see-through side view of the real-time clock in accordance with the embodiment of the invention.

FIG. 18 is a schematic see-through plan view of the real-time clock 600 in accordance with the present embodiment, and FIG. 19 is a schematic see-through side view of the real-time clock 600. It is noted that FIG. 19 is a figure viewed in a direction of arrows XIX of FIG. 18.

An IC chip 651 having an oscillation circuit or the like is affixed with adhesive such as conductive adhesive to an island section 653 of a lead frame 652. Electrode pads 654 provided on the top surface of the IC chip 651 are electrically connected to I/O lead terminals 656 disposed along a peripheral section of the package by bonding wires 655. In a plan view, an oscillator housing 657 that stores therein the piezoelectric oscillator 100 is disposed next to the IC chip 651. For example, the piezoelectric oscillator 100 is air-tightly sealed in the oscillator housing 657. Leads 658 that are electrically connected to the respective electrodes of the piezoelectric oscillator 100 protrude outside from within the oscillator housing 657. The leads 658 are affixed with adhesive such as conductive adhesive to connection pads 659 of the lead frame 652. The IC chip 651, the lead frame 652 and the oscillator housing 657 are packaged in one piece with resin 660.

Further, although not illustrated, a semiconductor process may be applied to areas in the substrate 2 (see FIG. 2) and the second semiconductor layer 11 (see FIG. 4) other than the area where the piezoelectric oscillator 100 is formed, whereby an IC adjacent in the plane to the piezoelectric oscillator 100 may be formed, and the real-time clock in accordance with the present embodiment may be formed. By this, the packaging can be omitted, and a one-chip type real-time clock can be formed.

7. Next, a radio clock receiver module having the piezoelectric oscillator described above is described.

Figure 20:
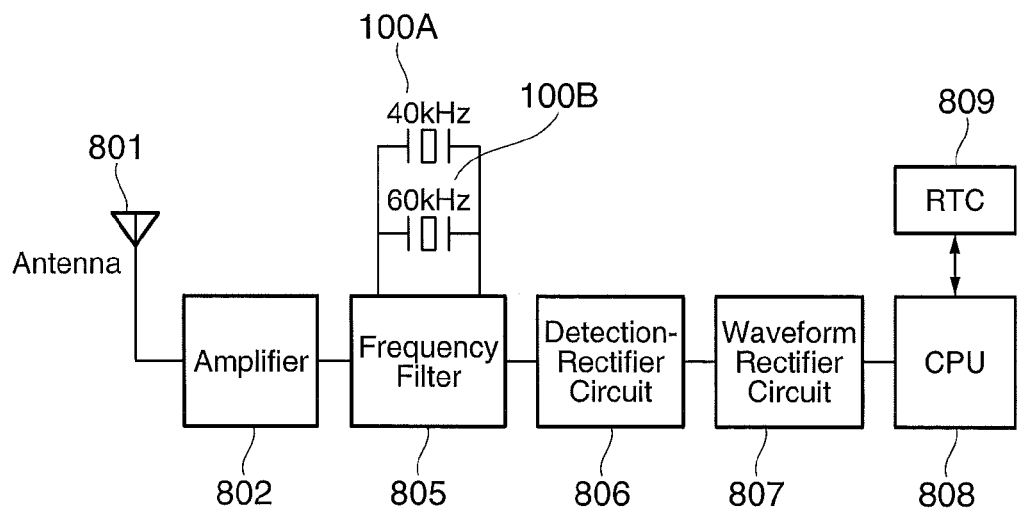
FIG. 20 is a schematic circuit block diagram of a radio clock receiver module in accordance with an embodiment of the invention.

FIG. 20 is a circuit block diagram schematically showing a radio clock receiver module in accordance with an embodiment of the invention.

A frequency filter 805 of the radio clock receiver module has the piezoelectric oscillator 100 described above (100A and 100B in this example).

A radio clock is a clock equipped with the function to receive a standard radio wave including time information, automatically correcting the time and displaying the time. Within Japan, there are radio stations in Fukushima Prefecture (40 kHz) and Saga Prefecture (60 kHz) that broadcast standard radio waves.

An antenna 801 receives a longwave standard radio wave at 40 kHz or 60 kHz. The standard radio wave is composed of an amplification-modulated (AM) 40 kHz or 60 kHz carrier wave and time information (time code) superposed thereon.

The received standard radio wave is amplified by an amplifier 802, and filtered and tuned by the frequency filter 805 with the piezoelectric oscillator 100A or 100b having a resonance frequency that is the same as the carrier frequency. The filtered signal of the predetermined frequency is detected and demodulated by a detection-rectifier circuit 806. Then, the time code is retrieved from the signal by a waveform rectifier circuit 807, and counted by a central processing unit (CPU) 808. The CPU 808 reads information for, for example, the current year, the total days, the day of week, the time and the like. The readout information is reflected on a real-time clock (RTC) 809, whereby correct time information is displayed.

Because the carrier radio wave is 40 kHz or 60 kHz, the piezoelectric oscillators in accordance with the present embodiment of the invention are suitable for the piezoelectric oscillators 100A and 100B of the frequency filter 805. For example, in the case of 40 kHz, a piezoelectric oscillator having the following dimensions can be used. For example, the thickness of the first electrode 22 is 50 nm, the thickness of the piezoelectric layer 24 is 100 nm, the thickness of the second electrode 26 is 50 nm, the thickness of the oscillation section 10 is 100 nm, the length of the oscillation section 10 is 92 nm, and the width of the oscillation section 10 is 40 nm.

Furthermore, although not illustrated, a semiconductor process may be applied to areas in the substrate 2 (see FIG. 2) and the second semiconductor layer 11 (see FIG. 4) other than the area where the piezoelectric oscillator 100 is formed, whereby an IC adjacent in the plane to the piezoelectric oscillator 100 may be formed, and the radio clock receiver module in accordance with the present embodiment may be formed. By this, a one-chip type radio clock receiver module can be formed, and its packaging can be omitted.

8. The embodiments of the invention are described above in detail. However, a person having an ordinary skill in the art should readily understand that many modifications can be made without departing in substance from the novel matter and effect of the invention. Accordingly, those modified examples are also deemed included in the scope of the invention.

What is claimed is:

1. A method for manufacturing a piezoelectric oscillator, the method comprising the steps of:
    forming a first semiconductor layer above a substrate;
    forming a second semiconductor layer above the first semiconductor layer;

forming a first opening section that exposes the substrate by removing the second semiconductor layer and the first semiconductor layer in an area for forming a support section;

forming the support section in the first opening section;

forming a driving section that generates flexing vibration in an oscillation section above the second semiconductor layer;

patterning the second semiconductor layer to form the oscillation section having the supporting section as a base end and another end provided so as not to contact the supporting section, and a second opening section that exposes the first semiconductor layer; and removing the first semiconductor layer through a portion exposed at the second opening section by an etching method, thereby forming a cavity section at least below the oscillation section, wherein the step of forming the driving section includes the steps of forming a first electrode, forming a piezoelectric layer above the first electrode, and forming a second electrode above the piezoelectric layer.

2. A method for manufacturing a piezoelectric oscillator according to claim 1, wherein, in the step of removing the first semiconductor layer, the etching rate of the first semiconductor layer is greater than the etching rate of any of the substrate, the oscillation section and the supporting section.

3. A method for manufacturing a piezoelectric oscillator according to claim 1, wherein the first semiconductor layer is formed from silicon germanium, and the substrate, the oscillation section and the supporting section are formed from silicon.

4. A method for manufacturing a piezoelectric oscillator according to claim 1, wherein the oscillation section is formed to have a thickness of 100 nm or less.

5. A method for manufacturing a piezoelectric oscillator according to claim 1, wherein the oscillation section is formed to have a length of 100 μm or less.

6. A method for manufacturing a piezoelectric oscillator according to claim 1, wherein the piezoelectric oscillator is formed to have a resonance frequency at $2^{13}$ Hz (8.192 kHz) or higher, and $2^{15}$ Hz (32.768 kHz) or lower.

* * * * *